United States Patent
Shirai

(10) Patent No.: US 9,702,057 B2
(45) Date of Patent: Jul. 11, 2017

(54) METHOD FOR PRODUCING AN N-TYPE SIC SINGLE CRYSTAL FROM A SI—C SOLUTION COMPRISING A NITRIDE

(71) Applicant: Takayuki Shirai, Susono (JP)

(72) Inventor: Takayuki Shirai, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 100 days.

(21) Appl. No.: 14/650,664

(22) PCT Filed: Apr. 1, 2013

(86) PCT No.: PCT/JP2013/059984
§ 371 (c)(1),
(2) Date: Jun. 9, 2015

(87) PCT Pub. No.: WO2014/103394
PCT Pub. Date: Jul. 3, 2014

(65) Prior Publication Data
US 2015/0299896 A1    Oct. 22, 2015

(30) Foreign Application Priority Data
Dec. 28, 2012  (JP) .................................. 2012-288239

(51) Int. Cl.
*C30B 19/04*  (2006.01)
*C30B 19/06*  (2006.01)
(Continued)

(52) U.S. Cl.
CPC ............ *C30B 19/062* (2013.01); *C30B 17/00* (2013.01); *C30B 19/04* (2013.01); *C30B 19/067* (2013.01);
(Continued)

(58) Field of Classification Search
CPC .... C30B 9/00; C30B 9/04; C30B 9/08; C30B 9/10; C30B 15/00; C30B 15/20; C30B 17/00; C30B 19/00; C30B 19/02; C30B 19/04; C30B 19/062; C30B 19/08; C30B 19/10; C30B 19/106; C30B 29/00; C30B 29/10; C30B 29/36
(Continued)

(56) References Cited

U.S. PATENT DOCUMENTS

2011/0297893 A1    12/2011  Seki et al.
2012/0308758 A1    12/2012  Hori et al.

FOREIGN PATENT DOCUMENTS

JP    H0977594 A        3/1997
JP    2007-153719   *   6/2007
(Continued)

*Primary Examiner* — Kenneth A Bratland, Jr.
(74) *Attorney, Agent, or Firm* — Oliff PLC

(57) ABSTRACT

Provided is a method for producing an n-type SiC single crystal, whereby it is possible to grow an n-type SiC single crystal having a low resistivity at a high speed. A method for producing an n-type SiC single crystal by bringing a SiC seed crystal substrate into contact with a Si—C solution having such a temperature gradient that the temperature gradually decreases from the inside toward the surface, thereby achieving the crystal growth of the n-type SiC single crystal. The method involves adding a nitride to a raw material for forming the Si—C solution or to the Si—C solution.

4 Claims, 3 Drawing Sheets

(51) Int. Cl.
    *C30B 29/36*     (2006.01)
    *C30B 17/00*     (2006.01)
    *C30B 19/08*     (2006.01)
    *C30B 19/10*     (2006.01)
    *C30B 19/12*     (2006.01)

(52) U.S. Cl.
    CPC ............ *C30B 19/068* (2013.01); *C30B 19/08* (2013.01); *C30B 19/106* (2013.01); *C30B 19/12* (2013.01); *C30B 29/36* (2013.01)

(58) Field of Classification Search
    USPC ... 117/11, 13, 19, 21, 36, 54, 64–65, 67, 73, 117/76, 78–79, 937, 951, 60
    See application file for complete search history.

(56) References Cited

FOREIGN PATENT DOCUMENTS

| | | |
|---|---|---|
| JP | 2007153719 A | 6/2007 |
| JP | 2008105896 A | 5/2008 |
| JP | 2010189235 A | 9/2010 |
| JP | 4661571 B2 | 3/2011 |
| JP | 2012250864 A | 12/2012 |

\* cited by examiner

3mm

3mm

3mm

3mm

METHOD FOR PRODUCING AN N-TYPE SIC SINGLE CRYSTAL FROM A SI—C SOLUTION COMPRISING A NITRIDE

TECHNICAL FIELD

The present invention relates to a method for producing an n-type SiC single crystal that is suitable as a semiconductor element.

BACKGROUND ART

SiC single crystals are thermally and chemically very stable, superior in mechanical strengths, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved into the molten liquid, and a SiC crystal layer is deposited and grown on a seed crystal substrate set in the low temperature section. Solution processes can be expected to reduce defects since crystal growth is carried out in a state of near thermal equilibrium, compared to gas phase processes. In recent years, therefore, several methods for producing SiC single crystals by solution processes have been proposed, and for example, methods for obtaining SiC single crystals with few crystal defects have also been proposed (PTL 1).

It has also been attempted to obtain SiC single crystals with low volume resistivity (hereunder referred to as "resistivity") in order to reduce electric power loss when such SiC single crystals are to be applied in electronic devices, such as power devices. For example, in order to lower the resistivity of a SiC single crystal, it has been proposed to supply nitrogen gas into a crucible by a solution process, dope the SiC single crystal with an n-type dopant, and grow an n-type SiC single crystal with low resistivity (PTL 2).

CITATION LIST

Patent Literature

[PTL 1] Japanese Unexamined Patent Publication No. 2008-105896

[PTL 2] Japanese Unexamined Patent Publication No. 2010-189235

SUMMARY OF THE INVENTION

Problems to be Solved by the Invention

Thus, attempts have been made to obtain high quality SiC single crystals by solution processes. However, when nitrogen gas is supplied into a crucible to grow an n-type SiC single crystal as in PTL 2, increasing the growth rate has led to a problem in that miscellaneous crystals are generated in the grown crystal, making it impossible to obtain a single crystal.

The present invention has been accomplished in light of these circumstances, and its object is to provide a method for producing an n-type SiC single crystal that allows an n-type SiC single crystal with low resistivity to be grown at a rapid rate.

Means for Solving the Problems

The present invention is a method for producing an n-type SiC single crystal wherein a SiC seed crystal substrate is contacted with a Si—C solution having a temperature gradient in which the temperature falls from the interior toward the surface, to cause crystal growth of an n-type SiC single crystal, the method comprising adding a nitride to the starting material used to form the Si—C solution, or to the Si—C solution.

Effect of the Invention

According to the invention it is possible to obtain an n-type SiC single crystal grown at a rapid rate and having low resistivity.

DESCRIPTION OF EMBODIMENTS

Figure 1:
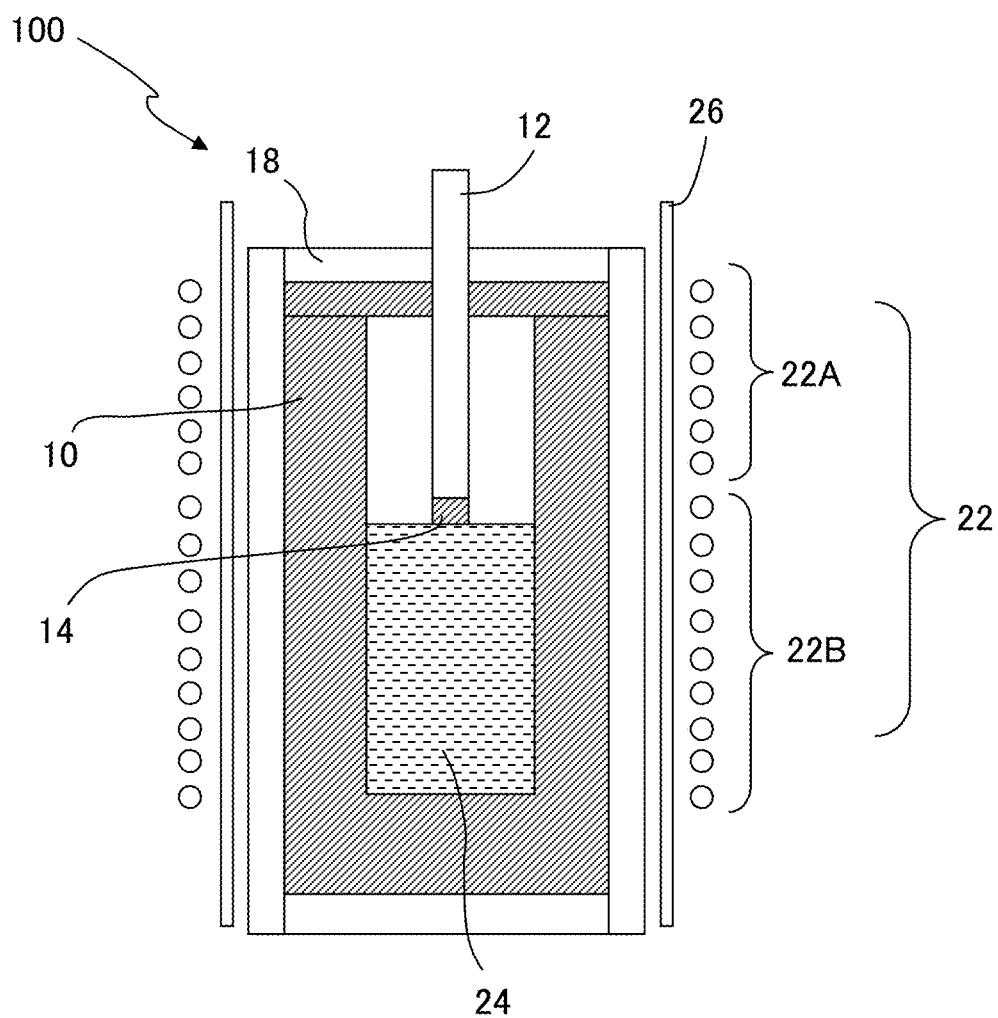
FIG. 1 is a cross-sectional schematic drawing of a single crystal production apparatus based on a solution process, to be used for the invention.

As mentioned above, a method has been proposed in the prior art for obtaining an n-type SiC single crystal doped with nitrogen by a solution process, which is a method of supplying nitrogen to the Si—C solution by adding nitrogen gas to the atmosphere in the growth furnace or converting the atmosphere in the growth furnace to a nitrogen atmosphere.

In the prior art methods, a high-nitrogen-concentration region forms in the surface region of the Si—C solution so that nitrogen dissolves from the gas phase in the growth furnace into the liquid phase. When the temperature gradient in the surface region of the Si—C solution is increased to speed the growth rate, miscellaneous crystals are generated in the high-nitrogen-concentration region, and the generated miscellaneous crystals adhere onto the growth surface of the grown crystal, inhibiting growth of the SiC single crystal.

The present inventors have conducted much research aimed at solving this problem, and have found that by directly adding a nitride to a starting material for formation of the Si—C solution, or to the Si—C solution, it is possible to form a substantially uniform nitrogen concentration in the Si—C solution to inhibit formation of a high-nitrogen-concentration region in the surface region of the Si—C solution.

The method for producing an n-type SiC single crystal according to the invention employs a solution process wherein a SiC seed crystal substrate is contacted with a Si—C solution having a temperature gradient in which the temperature falls from the interior toward the surface, to cause crystal growth of an n-type SiC single crystal, and the method comprises adding a nitride to a starting material used to form the Si—C solution, or to the Si—C solution.

According to the method of the invention it is possible to obtain an n-type SiC single crystal grown at a rapid rate and having low resistivity.

The nitride to be used in the method of the invention is a nitride that exhibits a liquid phase in the Si—C solution. The nitride that exhibits a liquid phase in the Si—C solution does not necessarily need to be a nitride with a melting point below the temperature of the Si—C solution, and it is sufficient if at least a portion of the nitride, and preferably substantially all of the nitride, exhibits a liquid phase in the molten Si—C liquid.

The nitride to be used in the method of the invention is preferably a metal nitride that is solid at ordinary temperature, more preferably it is a compound of nitrogen and a transition element, such as Cr, Ti or Ni, a compound of nitrogen and a typical element, such as Ge, a compound of nitrogen and a non-metal element, such as Si, or a mixture thereof, even more preferably it is a compound of nitrogen and an element of Group 14, such as Si or Ge, or a compound of nitrogen and an element of period 4, such as Cr or Ge, and examples include chromium nitride ($Cr_2N$ and/or CrN), silicon nitride ($Si_3N_4$), germanium nitride ($Ge_3N_4$), titanium nitride (TiN and/or $Ti_2N$), nickel nitride ($Ni_4N$ and/or $Ni_3N$), and mixtures thereof. The nitride used in the method of the invention is preferably chromium nitride ($Cr_2N$ and/or CrN), silicon nitride ($Si_3N_4$) or germanium nitride ($Ge_3N_4$), and more preferably chromium nitride ($Cr_2N$ and/or CrN). The nitride may also include compounds with different valencies, other than those mentioned.

The added nitride may be mixed with a starting material for formation of the Si—C solution, or with the Si—C solution, to form a solvent for the nitrogen-containing Si—C solution.

The nitride may be added so that the Si—C solution has the prescribed nitrogen content. The amount of nitride added is preferably 0.02 wt % or greater, more preferably 0.04 wt % or greater, even more preferably 0.06 wt % or greater and most preferably 0.08 wt % or greater, in terms of nitrogen atoms based on the total amount of nitrogen-containing Si—C solution.

There is no particular restriction on the upper limit for the amount of nitride added, but it may be no greater than 1.0 wt % in terms of nitrogen atoms based on the total amount of nitrogen-containing Si—C solution. When nitrogen is dissolved in the Si—C solution at 1.0 wt %, nitrogen atoms are incorporated into the grown SiC crystal at $10^{21}/cm^3$. Since the solubility limit of nitrogen in a SiC crystal is $10^{21}/cm^3$, it is not possible to achieve solid dissolution of nitrogen in the SiC crystal at a concentration of greater than $10^{21}/cm^3$ even if nitrogen is dissolved in the Si—C solution at greater than 1.0 wt % in terms of nitrogen atoms based on the total amount of the nitrogen-containing Si—C solution.

The nitride may be added to a starting material for forming a Si—C solution before melting, or it may be added to the Si—C solution.

In the method of the invention, the temperature gradient in which the temperature falls from the interior of the solution toward the surface of the solution in a range of 1 cm from the surface of the Si—C solution is preferably 20° C./cm or greater, more preferably 30° C./cm or greater and even more preferably 42° C./cm or greater, to allow growth of an n-type SiC single crystal having low resistivity. There is no particular restriction on the upper limit of the temperature gradient, but the temperature gradient that can be actually formed may substantially be the upper limit, and it may be about 60° C./cm, for example.

In the method of the invention, the temperature gradient can be increased in this manner, thereby allowing the SiC single crystal growth rate to be preferably 100 μm/h or higher, more preferably 150 μm/h or higher, even more preferably 200 μm/h or higher, yet more preferably 300 μm/h or higher, and even yet more preferably 400 μm/h, and for example, a SiC single crystal can be grown at 400 to 500 μm/h. There is no particular restriction on the upper limit for the growth rate of the SiC single crystal, but it will be limited by the upper limit of the temperature gradient that can be formed, and it may be 2000 μm/h, for example.

It can be easily determined whether or not a SiC single crystal has been obtained by observing whether miscellaneous crystals are present in the grown crystal, either by external observation or microscopy.

The method of the invention can yield an n-type SiC single crystal with low resistivity, and can yield a SiC single crystal having resistivity of preferably 10 mΩ·cm or lower, more preferably 8 mΩ·cm or lower, even more preferably 6 mΩ·cm or lower and yet more preferably 5 mΩ·cm or lower. A lower resistivity of the SiC single crystal is preferred, but the lower limit for the resistivity is about 1 mΩ·cm, due to the solubility limit of nitrogen in SiC crystals.

The resistivity value of the SiC single crystal can be measured by Hall measurement using the Van der Pauw method.

A solution process is used in the method for producing a SiC single crystal according to the invention. A solution process for production of a SiC single crystal is a process wherein the surface region of the Si—C solution becomes supersaturated due to formation of a temperature gradient in which the temperature decreases from the interior of the Si—C solution toward the surface of the solution in a crucible, and a SiC single crystal is grown on a seed crystal using the seed crystal contacting with the Si—C solution as the origin.

In the method of the invention, a SiC single crystal having quality commonly used for production of SiC single crystals may be used as the seed crystal substrate. For example, a SiC single crystal commonly formed by a sublimation process may be used as the seed crystal substrate. The seed crystal substrate to be used for the present method may have any desired shape, such as laminar, discoid, cylindrical, columnar, truncated circular conic or truncated pyramidal.

Placement of the seed crystal substrate in the single crystal production apparatus may be performed by holding the top face of the seed crystal substrate on the seed crystal holding shaft.

Contact of the seed crystal substrate with the Si—C solution may be performed by lowering the seed crystal holding shaft holding the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or be lower than the Si—C solution surface, but it is preferable that the Si—C solution does not contact with the seed crystal holding shaft in order to prevent generation of polycrystals. In such methods, the position of the seed crystal substrate may be adjusted during crystal growth.

The seed crystal holding shaft may be a graphite shaft holding the seed crystal substrate at one end face. The seed crystal holding shaft may have any desired shape, such as cylindrical or columnar, and there may be used a graphite shaft having the same end face shape as the top face of the seed crystal substrate.

According to the invention, a Si—C solution is a solution in which C is dissolved, where the solvent is a molten liquid of Si/X (X is one or more metals other than Si), and it further contains nitrogen. X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V, Fe and Ge.

The Si—C solution is preferably a molten liquid of Si/Cr/X (where X is one or more metals other than Si and Cr), and it further includes nitrogen. A Si—C solution wherein the solvent is a molten liquid with an atomic composition percentage of Si/Cr/X=30-80/20-60/0-10, has low variation in C dissolution and is therefore more preferred. For example, a starting material of Cr, Ni and the like may be loaded into the crucible in addition to Si, and a nitride, such as $Cr_2N$, may be added, to form a Si/Cr solution containing nitrogen, Si/Cr/Ni solution containing nitrogen, or the like.

In the method of the invention, the temperature of the Si—C solution is the surface temperature of the Si—C solution. The temperature of the surface of the Si—C solution is preferably 1800 to 2200° C., which will result in low fluctuation in the amount of carbon dissolving into the Si—C solution, and more preferably 2000 to 2200° C., in order to allow the amount of nitrogen dissolution in the Si—C solution to increase.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

FIG. 1 shows an example of a SiC single crystal production apparatus suitable for carrying out the method of the invention. The illustrated SiC single crystal production device 100 comprises a crucible 10, wherein the crucible 10 receives a Si—C solution 24 having carbon and nitrogen dissolved in a molten liquid of Si or Si/X, a temperature gradient is formed in which the temperature is lowered from the interior of the nitrogen-containing Si—C solution toward the surface of the solution, and the seed crystal substrate 14 that is held at the tip of the vertically movable graphite shaft 12 is contacted with the nitrogen-containing Si—C solution 24 to allow growth of the SiC single crystal. The crucible 10 and/or the graphite shaft 12 are preferably rotated.

The Si—C solution 24 is prepared by loading the starting materials, such as Si, Cr and Ni, into the crucible and further adding the nitride, melting them by heating to prepare a Si/X molten liquid, and dissolving C therein. As a separate method, the Si—C solution 24 is prepared by loading the starting materials, such as Si, Cr and Ni, into the crucible, melting them by heating to prepare a Si/X molten liquid, adding the nitride to the Si/X molten liquid and dissolving it, and dissolving C therein.

If the crucible 10 is a carbonaceous crucible, such as a graphite crucible, or SiC crucible, C will dissolve into the molten liquid by dissolution of the crucible 10, thereby forming a nitrogen-containing Si—C solution 24. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B can be independently regulated.

Since the temperature of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus and the crucible by using Ar, He, $N_2$ or the like.

The temperature of the Si—C solution usually has a temperature distribution with a lower temperature at the surface of the Si—C solution than the interior thereof due to thermal radiation and the like. Further, a prescribed temperature gradient can be formed in the Si—C solution 24 in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil 22. For example, the output of the upper level coil 22A may be smaller than the output of the lower level coil 22B, to form a prescribed temperature gradient in the Si—C solution 24 in which an upper portion of the solution is at low temperature and a lower portion of the solution is at high temperature.

The carbon that has dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the upper level/lower level of the coil 22, heat radiation from the surface of the Si—C solution 24, and heat loss through the graphite shaft 12. When the carbon that has dissolved in the lower part of the solution where the temperature and the solubility are high, reaches the region near the bottom face of the seed crystal substrate where the temperature and the solubility are low, a supersaturation state appears and a SiC single crystal is grown on the seed crystal substrate by virtue of the supersaturation as a driving force. In the present invention, the nitrogen dissolved in the Si—C solution 24 is also dispersed by diffusion and convection, similar to the carbon, becoming incorporated into the SiC grown crystal.

In some embodiments, meltback may be carried out in which the surface layer of the SiC seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably approximately 5 to 50 μm for sufficient removal of an affected layer and a natural oxide layer.

The meltback may be performed by forming a temperature gradient in which the temperature increases from the interior of the Si—C solution toward the surface of the solution, i.e., by forming, in the Si—C solution, a temperature gradient in a direction opposite to the case of SiC single crystal growth. The temperature gradient in the opposite direction can be formed by regulating the output of the high-frequency coil.

The meltback can also be performed, without forming a temperature gradient in the Si—C solution, by simply immersing the seed crystal substrate in the Si—C solution that has been heated to a higher temperature than the liquidus temperature. In that case, the dissolution rate increases with higher Si—C solution temperature, but control of the amount of dissolution becomes difficult, while a low temperature may also slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocations may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the graphite shaft. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

EXAMPLES

Example 1

There was prepared a SiC single crystal formed by a sublimation process, which was a discoid 4H—SiC single crystal with a diameter of 12 mm, a thickness of 700 μm, and the bottom face as the (000-1) face, for use as a seed crystal substrate. The seed crystal substrate had a resistivity of 20 mΩ·cm. The top face of the seed crystal substrate was bonded to roughly the center section of the end face of a cylindrical graphite shaft, using a graphite adhesive.

A single crystal production apparatus as shown in FIG. 1 was used, and Si/Cr/Ni with an atomic composition of 5:4:1 were charged into a graphite crucible for holding of the Si—C solution, as a molten liquid starting material for formation of the Si—C solution, and $Cr_2N$ powder (3N by Mitsuwa Chemicals Co., Ltd.) was further added as a nitride for a donor starting material so that a nitrogen atom content was 0.02 wt % with respect to the total amount of the nitrogen-containing Si—C solution.

After vacuum suction of the interior of the single crystal production apparatus to $1\times10^{-3}$ Pa, argon gas was introduced to 1 atmosphere to exchange the air inside the single crystal production apparatus with argon. The high-frequency coil was electrified to melt the starting material in the graphite crucible by heating, thereby forming a nitrogen-containing Si/Cr/Ni alloy molten liquid. Then, a sufficient amount of C was dissolved into the nitrogen-containing Si/Cr/Ni alloy molten liquid from the graphite crucible to form a Si—C solution.

The outputs of the upper level coil and lower level coil were adjusted to heat the graphite crucible so that the temperature on the surface of the Si—C solution was increased to 2100° C. and a temperature gradient became 30° C./cm, in which the temperature decreased from the solution interior in a range of 10 mm from the solution surface, toward the solution surface. Temperature measurement of the surface of the Si—C solution was performed with a radiation thermometer, and measurement of the temperature gradient of the Si—C solution was performed using a vertically movable thermocouple.

Seed touching was performed, in which the position of the bottom face of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft in parallel to the Si—C solution surface. The graphite shaft was then raised 1.5 mm so as to prevent the Si—C solution from seeping upward and contacting the graphite shaft, and was held at that position for 10 hours for growth of a crystal.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 1.5 mm, and the growth rate was 150 μm/h.

Figure 2:
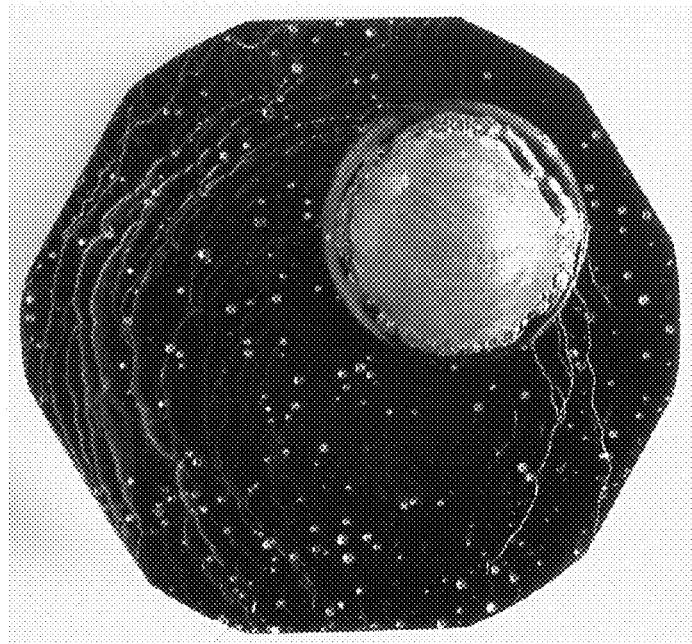
FIG. 2 is an external photograph of a grown crystal grown by the method of the invention, as observed from the (000-1) face as the growth surface.

FIG. 2 shows a photograph of the obtained grown crystal observed from the growth surface. The grown crystal was a SiC single crystal, with no miscellaneous crystals.

In order to measure the resistivity of the obtained grown crystal, the (0001) plane of the grown crystal was cut out from the growth surface to a thickness of 0.5 mm, mirror polished, worked to a 5 mm square, and cleaned, after which a circular Ni ohmic electrode with a diameter of 1 mm was formed by vacuum vapor deposition on the four corners of the (0001) plane. The electrode-attached grown crystal was used for Hall measurement by the Van der Pauw method at room temperature (25° C.), and measurement of the resistivity of the grown crystal revealed resistivity of 8 mΩ·cm, indicating that an n-type SiC single crystal was obtained.

Example 2

Crystal growth was carried out by the same method as Example 1, except that $Si_3N_4$ powder (3N by Kojundo Chemical Lab. Co., Ltd.) was added as a nitride for the donor starting material to the molten liquid starting material, in an amount for a nitrogen atom content of 0.02 wt % with respect to the total amount of the nitrogen-containing Si—C solution, to form the nitrogen-containing Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 1.5 mm, and the growth rate was 150 µm/h.

No miscellaneous crystals were seen in the obtained grown crystal and the resistivity of the grown crystal was 8 mΩ·cm, indicating that an n-type SiC single crystal was obtained.

Example 3

Crystal growth was carried out by the same method as Example 1, except that $Cr_2N$ powder (3N by Mitsuwa Chemicals Co., Ltd.) was added as a nitride for the donor starting material to the molten liquid starting material, in an amount for a nitrogen atom content of 0.06 wt % with respect to the total amount of the nitrogen-containing Si—C solution, to form the nitrogen-containing Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 1.5 mm, and the growth rate was 150 µm/h.

No miscellaneous crystals were seen in the obtained grown crystal and the resistivity of the grown crystal was 6 mΩ·cm, indicating that an n-type SiC single crystal was obtained.

Example 4

Crystal growth was carried out by the same method as Example 1, except that the nitrogen-containing Si—C solution was formed by adding $Cr_2N$ powder (3N by Kojundo Chemical Lab. Co., Ltd.) as a nitride for the donor starting material to the molten liquid starting material, in an amount for a nitrogen atom content of 0.06 wt % with respect to the total amount of the nitrogen-containing Si—C solution, and the outputs of the upper level coil and lower level coil were regulated so that the temperature gradient was 42° C./cm for the temperature decrease from the interior of the solution toward the surface of the solution in a range of 10 mm from the surface of the Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 4.0 mm, and the growth rate was 400 µm/h.

Figure 5:
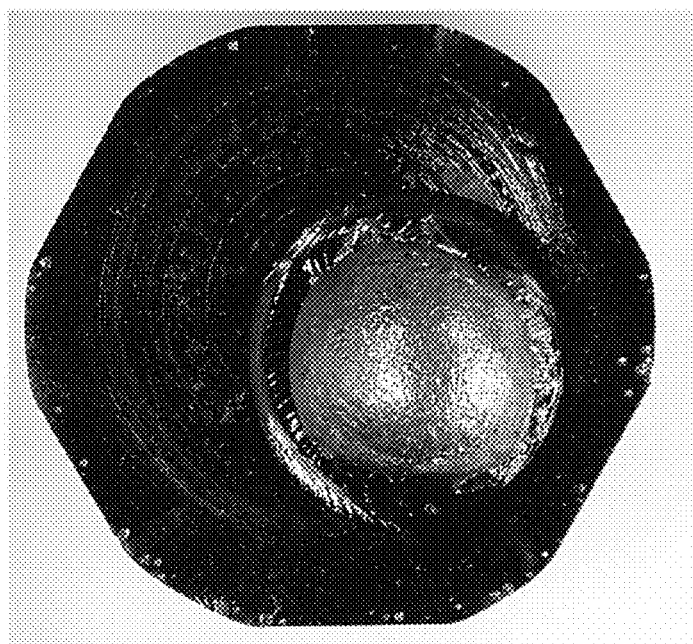
FIG. 5 is an external photograph of a grown crystal grown by the method of the invention, as observed from the (000-1) face as the growth surface.

FIG. 5 shows a photograph of the obtained grown crystal observed from the growth surface. No miscellaneous crystals were seen in the obtained grown crystal and the resistivity of the grown crystal was 6 mΩ·cm, indicating that an n-type SiC single crystal was obtained.

Example 5

Crystal growth was carried out by the same method as Example 1, except that $Cr_2N$ powder (3N by Kojundo Chemical Lab. Co., Ltd.) was added as a nitride for the donor starting material to the molten liquid starting material, in an amount for a nitrogen atom content of 0.08 wt % with respect to the total amount of the nitrogen-containing Si—C solution, to form the nitrogen-containing Si—C solution, and the outputs of the upper level coil and lower level coil were regulated so that the temperature gradient was 42° C./cm for temperature decrease from the interior of the solution toward the surface of the solution in a range of 10 mm from the surface of the Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 4.0 mm, and the growth rate was 400 µm/h.

No miscellaneous crystals were seen in the obtained grown crystal and the resistivity of the grown crystal was 5 mΩ·cm, indicating that an n-type SiC single crystal was obtained.

Example 6

Crystal growth was carried out by the same method as Example 1, except that $Ge_3N_4$ powder (3N by Kojundo Chemical Lab. Co., Ltd.) was added as a nitride for the donor starting material to the molten liquid starting material, in an amount for a nitrogen atom content of 0.02 wt % with respect to the total amount of the nitrogen-containing Si—C solution, to form the nitrogen-containing Si—C solution, and the outputs of the upper level coil and lower level coil were regulated so that the temperature gradient was 36° C./cm for temperature decrease from the interior of the solution toward the surface of the solution in a range of 10 mm from the surface of the Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 2.5 mm, and the growth rate was 250 µm/h.

No miscellaneous crystals were seen in the obtained grown crystal and the resistivity of the grown crystal was 8 mΩ·cm, indicating that an n-type SiC single crystal was obtained.

Reference Example 1

Crystal growth was carried out by the same method as Example 1, except that $Cr_2N$ powder (3N by Mitsuwa Chemicals Co., Ltd.) was added as a nitride for the donor starting material to the molten liquid starting material, in an amount for a nitrogen atom content of 0.01 wt % with respect to the total amount of the nitrogen-containing Si—C solution, to form the nitrogen-containing Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 1.5 mm, and the growth rate was 150 µm/h.

No miscellaneous crystals were seen in the obtained grown crystal and the resistivity of the grown crystal was 20 mΩ·cm, indicating that a SiC single crystal was obtained.

Comparative Example 1

After vacuum suction of the interior of the single crystal production apparatus to $1 \times 10^{-3}$ Pa, argon gas and nitrogen gas were introduced to 1 atmosphere to exchange the air inside the single crystal production apparatus with a mixed gas of 95 vol % argon and 5 vol % nitrogen. Crystal growth was carried out by the same method as Example 1, except that nitrogen gas was thus used instead of a nitride for the donor starting material, forming a Si—C solution without addition of a nitride, and the outputs of the upper level coil and lower level coil were regulated so that the temperature gradient was 10° C./cm for temperature decrease from the interior of the solution toward the surface of the solution in a range of 10 mm from the surface of the Si—C solution. The average nitrogen concentration in the Si—C solution during the crystal growth was 0.02 wt % based on the total amount of the nitrogen-containing Si—C solution.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 12 mm and a thickness of 0.5 mm, and the growth rate was 50 µm/h.

Figure 3:
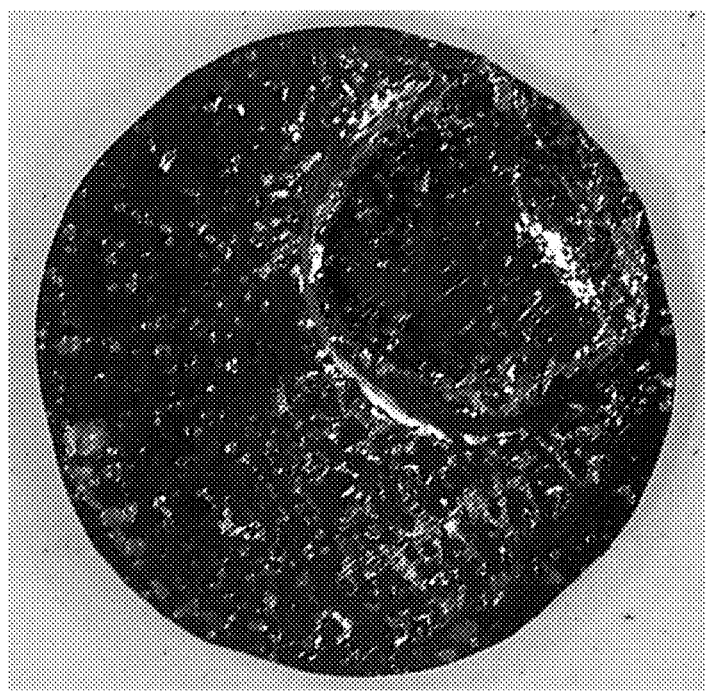
FIG. 3 is an external photograph of a grown crystal grown by a method of the prior art, as observed from the (000-1) face as the growth surface.

FIG. 3 shows a photograph of the obtained grown crystal observed from the growth surface. No miscellaneous crystals were seen in the obtained grown crystal and the resistivity of the grown crystal was 8 mΩ·cm, indicating that an n-type SiC single crystal was obtained.

Comparative Example 2

Crystal growth was carried out by the same method as Comparative Example 1, except that the outputs of the upper level coil and lower level coil were regulated so that the temperature gradient was 30° C./cm for temperature decrease from the interior of the solution toward the surface of the solution in a range of 10 mm from the surface of the Si—C solution.

Figure 4:
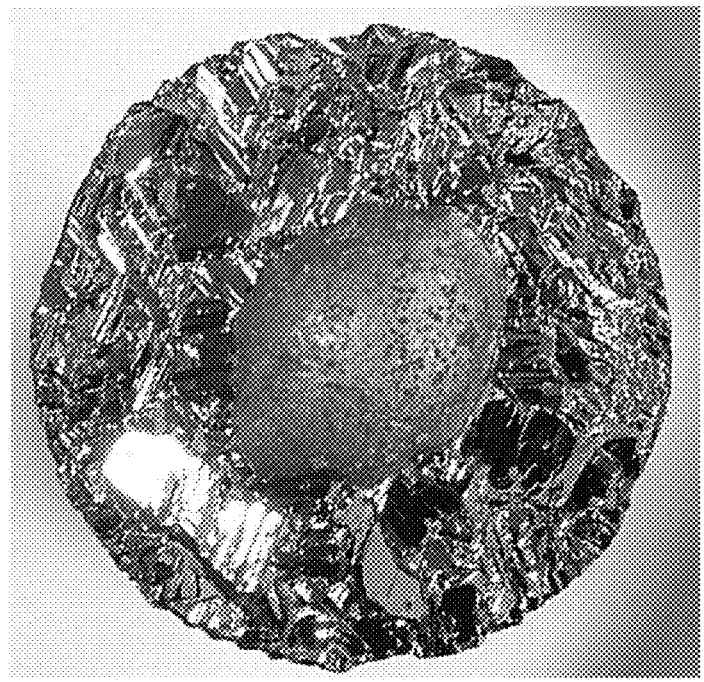
FIG. 4 is an external photograph of a grown crystal grown by a method of the prior art, as observed from the (000-1) face as the growth surface.

FIG. 4 shows a photograph of the obtained grown crystal observed from the growth surface. The grown crystal contained miscellaneous crystals, and a SiC single crystal could not be obtained.

The conditions and results for Example 1 to 6, Reference Example 1 and Comparative Example 1 to 2 are summarized in Table 1.

TABLE 1

| | Donor starting material | Nitrogen concentration in Si—C solution (wt %) | Temperature gradient of Si—C solution (° C./cm) | Single crystal growth | Resistivity (mΩcm) | Growth rate (µm/h) |
| --- | --- | --- | --- | --- | --- | --- |
| Example 1 | Chromium nitride | 0.02 | 30 | G | 8 | 150 |
| Example 2 | Silicon nitride | 0.02 | 30 | G | 8 | 150 |
| Example 3 | Chromium nitride | 0.06 | 30 | G | 6 | 150 |
| Example 4 | Chromium nitride | 0.06 | 42 | G | 6 | 400 |
| Example 5 | Chromium nitride | 0.08 | 42 | G | 5 | 400 |
| Example 6 | Germanium nitride | 0.02 | 36 | G | 8 | 250 |
| Ref. Ex. 1 | Chromium nitride | 0.01 | 30 | G | 20 | 150 |
| Comp. Ex. 1 | Nitrogen gas | 0.02 | 10 | G | 8 | 50 |
| Comp. Ex. 2 | Nitrogen gas | 0.02 | 30 | P | — | — |

When nitrogen gas was used as the donor starting material and the growth rate was increased, a single crystal was not be obtained. However, when a nitride was used as the donor starting material, an n-type SiC single crystal with low resistivity was obtained at a high growth rate.

EXPLANATION OF SYMBOLS

100 Single crystal production apparatus
10 Graphite crucible
12 Graphite shaft
14 Seed crystal substrate
18 Heat-insulating material
22 High-frequency coil
22A Upper level high-frequency coil
22B Lower level high-frequency coil
24 Si—C solution
26 Quartz tube

What is claimed is:

1. A method for producing an n-type SiC single crystal wherein a SiC seed crystal substrate is contacted with a Si—C solution having a temperature gradient in which the temperature falls from the interior toward the surface, to cause crystal growth of an n-type SiC single crystal,
the method comprising adding a nitride to a starting material used to form the Si—C solution, or to the Si—C solution,
wherein the nitride is at least one selected from the group consisting of chromium nitride, germanium nitride, and nickel nitride.

2. The method according to claim 1, wherein the amount of nitride added is 0.02 wt % or greater in terms of nitrogen atoms, based on the total amount of the nitrogen-containing Si—C solution.

3. The method according to claim 1, wherein the surface temperature of the Si—C solution is 1800 to 2200° C.

4. The method according to claim 2, wherein the surface temperature of the Si—C solution is 1800 to 2200° C.

* * * * *